(12) United States Patent
Ahmad

(10) Patent No.: US 8,598,986 B2
(45) Date of Patent: Dec. 3, 2013

(54) REMOTE MONITORING AND CONTROL OF LED BASED STREET LIGHTS

(75) Inventor: Rizwan Ahmad, Summit, NJ (US)

(73) Assignee: Dialight Corporation, Farmingdale, NJ (US)

( * ) Notice: Subject to any disclaimer, the term of this patent is extended or adjusted under 35 U.S.C. 154(b) by 531 days.

(21) Appl. No.: 12/431,326

(22) Filed: Apr. 28, 2009

(65) Prior Publication Data
US 2010/0271178 A1 Oct. 28, 2010

(51) Int. Cl.
*H05B 37/02* (2006.01)
*G05B 23/02* (2006.01)
*G05B 11/01* (2006.01)

(52) U.S. Cl.
USPC .............. 340/10.1; 315/312; 340/3.1; 700/19

(58) Field of Classification Search
USPC .......... 40/557; 315/312; 362/311.02, 240, 85; 340/10.1–10.52, 310.11, 635, 815.45, 340/906–907, 909, 915, 917, 924, 944, 3.1; 700/17, 19
See application file for complete search history.

(56) References Cited

U.S. PATENT DOCUMENTS

| | | | | |
|---|---|---|---|---|
| 3,944,723 | A | * | 3/1976 | Fong .................... 178/3 |
| 4,580,099 | A | * | 4/1986 | Zetti .................... 324/414 |
| 4,924,151 | A | | 5/1990 | D'Aleo et al. |
| 5,095,502 | A | * | 3/1992 | Finzel .................. 379/40 |
| 5,471,201 | A | * | 11/1995 | Cerami et al. ........... 340/641 |
| 5,811,975 | A | * | 9/1998 | Bernardo .............. 324/414 |
| 5,923,269 | A | * | 7/1999 | Shuey et al. ............ 340/870.02 |
| 5,962,991 | A | * | 10/1999 | Levy .................. 315/312 |
| 6,046,550 | A | | 4/2000 | Ference et al. |
| 6,489,733 | B1 | * | 12/2002 | Schmidt et al. .......... 315/312 |
| 7,471,051 | B1 | | 12/2008 | Wacknov et al. |
| 7,546,168 | B2 | * | 6/2009 | Walters et al. .......... 700/17 |
| 7,791,492 | B2 | * | 9/2010 | Nam et al. ............ 340/635 |
| 7,817,063 | B2 | * | 10/2010 | Hawkins et al. ........ 340/870.07 |
| 7,825,793 | B1 | | 11/2010 | Spillman et al. |
| 8,242,887 | B2 | | 8/2012 | Cornwall et al. |
| 2003/0041107 | A1 | | 2/2003 | Blattner et al. |
| 2004/0105264 | A1 | * | 6/2004 | Spero .................. 362/276 |
| 2004/0189722 | A1 | * | 9/2004 | Acres .................. 345/866 |
| 2005/0174473 | A1 | | 8/2005 | Morgan et al. |
| 2005/0238044 | A1 | | 10/2005 | Osterloh et al. |

(Continued)

FOREIGN PATENT DOCUMENTS

| | | | | |
|---|---|---|---|---|
| JP | 10234142 A | * | 9/1998 | .......... H02J 13/00 |
| WO | WO 2009124453 A1 | * | 10/2009 | .......... H05B 37/03 |
| WO | WO 2010101370 A2 | * | 9/2010 | .......... F21S 8/08 |
| WO | WO 2010/125325 A1 | | 11/2010 | |

OTHER PUBLICATIONS

International Search Report and Written Opinion for PCT/GB2009/050437, Feb. 3, 2010, copy consists of 9 pages.

(Continued)

*Primary Examiner* — Steven Lim
*Assistant Examiner* — Stephen Burgdorf

(57) ABSTRACT

The present invention is directed to a method for remotely monitoring and controlling a light emitting diode. In one embodiment, the method includes establishing a two-way communication path via a communication module to a central office, wherein said communication module is coupled to said LED based street light and sending information related to the LED based street light to the central office via the two-way communication path.

17 Claims, 7 Drawing Sheets

(56) References Cited

U.S. PATENT DOCUMENTS

| | | | |
|---|---|---|---|
| 2006/0023853 A1* | 2/2006 | Shelley et al. | 379/106.03 |
| 2006/0044158 A1* | 3/2006 | Womble et al. | 340/870.02 |
| 2006/0076908 A1 | 4/2006 | Morgan et al. | |
| 2006/0202864 A1* | 9/2006 | Pirschel | 340/945 |
| 2007/0165835 A1 | 7/2007 | Berkman | |
| 2007/0200553 A1* | 8/2007 | Morrison | 324/142 |
| 2008/0051036 A1* | 2/2008 | Vaswani et al. | 455/69 |
| 2008/0052253 A1 | 2/2008 | Edwards et al. | |
| 2008/0074284 A1* | 3/2008 | Edwards et al. | 340/870.02 |
| 2008/0074289 A1* | 3/2008 | Sauder et al. | 340/909 |
| 2008/0143493 A1 | 6/2008 | Nam et al. | |
| 2008/0191897 A1* | 8/2008 | McCollough | 340/825.22 |
| 2009/0135836 A1 | 5/2009 | Veillette | |
| 2009/0153357 A1* | 6/2009 | Bushman et al. | 340/870.02 |
| 2009/0187284 A1* | 7/2009 | Kreiss et al. | 700/291 |
| 2009/0271045 A1* | 10/2009 | Savelle et al. | 700/284 |
| 2009/0303703 A1* | 12/2009 | Kao et al. | 362/183 |
| 2009/0309749 A1* | 12/2009 | Gilbert et al. | 340/815.45 |
| 2009/0312968 A1* | 12/2009 | Phillips | 702/62 |
| 2010/0141153 A1* | 6/2010 | Recker et al. | 315/149 |
| 2010/0164386 A1* | 7/2010 | You | 315/129 |
| 2010/0222932 A1 | 9/2010 | O'Connor | |
| 2010/0231131 A1* | 9/2010 | Anderson | 315/152 |
| 2011/0001626 A1* | 1/2011 | Yip et al. | 340/635 |
| 2011/0004764 A1* | 1/2011 | Stuber | 713/176 |
| 2011/0053492 A1 | 3/2011 | Hochstein | |
| 2011/0066297 A1 | 3/2011 | Saberi et al. | |
| 2011/0103274 A1* | 5/2011 | Vavik | 370/293 |

OTHER PUBLICATIONS

Office Action from CA Application No. 2,701,974, Sep. 20, 2012, copy consists of 4 pages.

EP Examination Report Application No. 09 785 218.0, Jul. 8, 2013, copy consists of 10 pages.

Office Action from CA 2,701,974, dated May 10, 2013, copy consists of 2 unnumbered pages.

Office Action from CA 2,760,380, dated Dec. 13, 2012, copy consists of 2 unnumbered pages.

* cited by examiner

US 8,598,986 B2

REMOTE MONITORING AND CONTROL OF LED BASED STREET LIGHTS

CROSS REFERENCE TO RELATED APPLICATIONS

This application is related to PCT Provisional Patent Application Ser. No. PCT/GB2009/050437, filed on Apr. 28, 2009, entitled "METHOD AND APPARATUS FOR MULTI-ZONED ILLUMINATION", the contents of each of the above referenced applications is incorporated herein by reference.

FIELD OF THE INVENTION

The present invention is directed to remote monitoring and control of LED based street lights through a communication system employed by an advanced metering infrastructure (AMI) or an advanced meter reading (AMR).

BACKGROUND OF THE INVENTION

A street light is a raised source of light on an edge of a road which is turned on or lit at a certain time every day. The street lights may be high intensity discharge (HID) where sodium (in an excited state) in the case of a high pressure sodium (HPS) lights or a mixture of gases (by passing an electric arc through them) in the case of metal halide (MH) lights are used to produce light. Modern street lights have light-sensitive photocells to turn them on at dusk, turn them off at dawn or activate them automatically in dark weather.

Currently, street lights are inefficient and large amounts of energy are consumed to power the street lights. In addition, street lights are not monitored or controlled remotely. For example, a central office cannot monitor power consumption of street lights or diagnose a street light that fails.

SUMMARY OF THE INVENTION

The present invention is directed to a method for remotely monitoring and controlling a light emitting diode (LED) based street light. In one embodiment, the method comprises establishing a two-way communication path via a communication module to a central office, wherein said communication module is coupled to said LED based street light and sending information related to said LED based street light to said central office via said two-way communication path.

The present invention provides another embodiment of a method for remotely monitoring and controlling at least one light emitting diode (LED) based street light. The method comprises establishing a two-way communication path with said at least one LED based street light via a communication module coupled to said LED based street light and receiving information related to said at least one LED based street light via said two-way communication path.

The present invention provides another embodiment of a method for remotely monitoring and controlling at least one light emitting diode (LED) based street light. The method comprises establishing a two-way communication path with said at least one LED based street light via a communication module coupled to said at least one LED based street light, establishing a two-way communication path with a central office, collecting information related to said at least one LED based street light via said two-way communication path with said at least one LED based street light and transmitting said collected information to said central office via said two-way communication path with said central office.

BRIEF DESCRIPTION OF THE DRAWINGS

So that the manner in which the above recited features of the present invention can be understood in detail, a more particular description of the invention, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

Embodiments of the present invention allow a light emitting diode (LED) based street light to be monitored and controlled remotely. For example, a central office of a utility company may monitor the LED based street lights individually or in groups of LED based street lights and also control the LED based street lights individually or in groups.

In addition, embodiments of the present invention may utilize existing infrastructures. As a result, completely new infrastructures do not need to be built to implement the present invention. Rather, the present invention allows a communication module that is compatible with an existing infrastructure to be coupled to or integrated with the LED based street lights such that the present invention is "plug and play". In other words, a utility company may take advantage of the currently used communication infrastructure to deploy the ability to monitor and control one or more LED based street lights.

One example of an existing infrastructure is an advanced metering infrastructure (AMI) used by utility companies across North America. The present invention may take advantage of the systems and communications networks already in place in the AMI. This provides a low capital investment to deploy the present invention.

Figure 1:
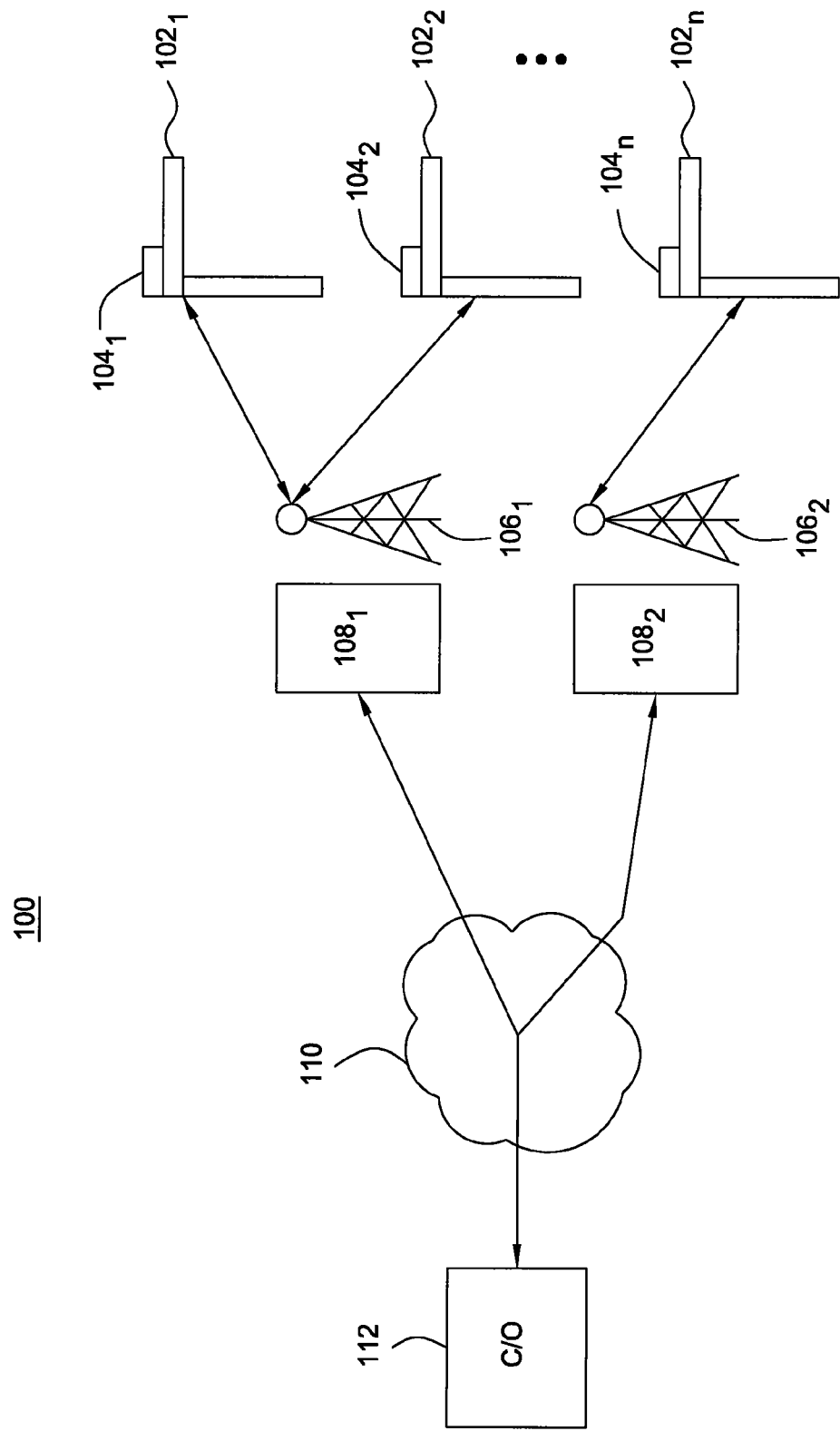
FIG. 1 depicts one embodiment of an architecture for remote monitoring and controlling of LED based street lights.

FIG. 1 illustrates one embodiment of an architecture 100 for remotely monitoring and controlling at least one LED based street light. The architecture 100 includes one or more LED based street lights $102_1$, $102_2$ to $102_n$ (herein collectively referred to as LED based street lights 102 or a LED based street light 102). Although only three LED based street lights 102 are illustrated in FIG. 1, those skilled in the art will recognize that the architecture 100 may include any number of LED based street lights 102.

The LED based street lights 102 may include one or more individual LEDs. In addition, one or more groups of LEDs may be organized within the LED based street lights 102. For example, each one of the one or more groups of LEDs may be utilized to illuminate a different area and may be independently controllable.

Each one of the LED based street lights $102_1$, $102_2$ to $102_n$ may be coupled to (e.g. in communication with) a communication module $104_1$, $104_2$ to $104_n$, respectively (herein collectively referred to as communication modules 104 or a communication module 104). In one embodiment, the communication module 104 may be integrated with the LED based street lights 102. For example, the LED based street lights 102 and integrated communication module 104 may come as a single integrated unit.

The communication module 104 may be any communication module that is compatible with the communication protocols used by the architecture 100. For example, if a paging communication protocol is used, the communication module 104 may be a Reflex Modem designed and manufactured by Dialight Corporation of South Farmingdale, N.J. However, those skilled in the art will recognize that any communication module 104 may be used.

In one embodiment, the communication module 104 may communicate via at least one of a 900 megahertz (MHz) spread spectrum band, a ZigBee protocol, a power line communication protocol, a cellular protocol, a satellite communication protocol, a paging communication protocol or any combination thereof. The communication protocol used by the communication module 104 will be dependent upon the communication protocol used by the underlying communication network.

For example, the architecture 100 may include one or more communication towers $106_1$ and $106_2$ and one or more gateways $108_1$ and $108_2$. Although only two communication towers 106 and two gateways 108 are illustrated in FIG. 1, those skilled in the art will recognize that any number of communication towers 106 and gateways 108 may be used.

In one embodiment, the communication towers 106 and the gateways 108 may be deployed by the utility company or AMI network service provider. For example, the communication towers 106 may be wide range communication towers that use a licensed two-way communication path between the communication towers 106 and the LED based street lights 102. The two-way communication path may use a 900 megahertz (MHz) spread spectrum protocol. Accordingly, the communication modules 104 may be a 900 MHz modem.

In another embodiment, the communication towers 106 may be a third party paging tower serviced by a telecommunications service provider. Thus, the two-way communications path may use a paging communications protocol, such as for example, ReFlex communications protocol. Accordingly, the communication module 104 may be a ReFlex modem.

The gateways 108 may communicate with a central office 112 via a public network 110. For example, the public network 110 may be an Internet Protocol (IP) network or a Cellular network, for example Global System for Mobile communications and General Packet Radio Service (GSM/GPRS) or Cell Division Multiple Access (CDMA). Thus, a two-way communications path may be established between the central office 112 and the LED based street lights 102.

Using the two-way communications path, the LED based street lights 102 may send information related to the LED based street lights 102 to the central office 112. In other words, the central office 112 may remotely monitor the LED based street lights 102. In addition, the central office 112 may send control signals to any one of the LED based street lights 102. In other words, the central office 112 may remotely control the LED based street lights 102. Notably, the central office 112 may remotely monitor and control individual LED based street lights 102, one or more groups of LEDs within a single LED based street light 102 or groups of LED based street lights 102.

The information related to the LED based street lights 102 may include report information or diagnostic information. In one embodiment, report information may include a burn time, a fault with a time-stamp, a number of ignitions, an amount of kilo-watt hours (KWH) usage, a number of functioning LEDs within the LED based street light 102, a light output factor of the LED based street light 102 or a light degradation factor of the LED based street light 102. In one embodiment, the diagnostic information may include a fixture malfunction or a photo controller failure.

The control signal may include a signal to turn on the LED based street light 102, turn off the LED based street light 102, adjust a brightness level of the LED based street light 102 or request an on demand health check of the LED based street light 102. For example, the control signal may be used to dim the LED based street light 102 if the central office 112 determines that a street illuminated by one or more particular LED based street lights 102 is not being used (e.g. no traffic on the street).

As discussed above, the LED based street light 102 may include one or more independently controllable groups of LEDs. The control signal may include a signal to control one of the independently controllable groups of LEDs as well. For example, the control signal may only turn on one group of LEDs, while leaving off other groups of LEDs within a single LED based street light 102.

Thus, the central office 112 may collect information related to each one of the LED based street lights 102 and control each one of the LED based street lights 102. As a result, the central office 112 may be able to maximize the efficiency of the LED based street lights 102, reducing energy usage and overall cost to operate the LED based street lights 102.

Figure 2:
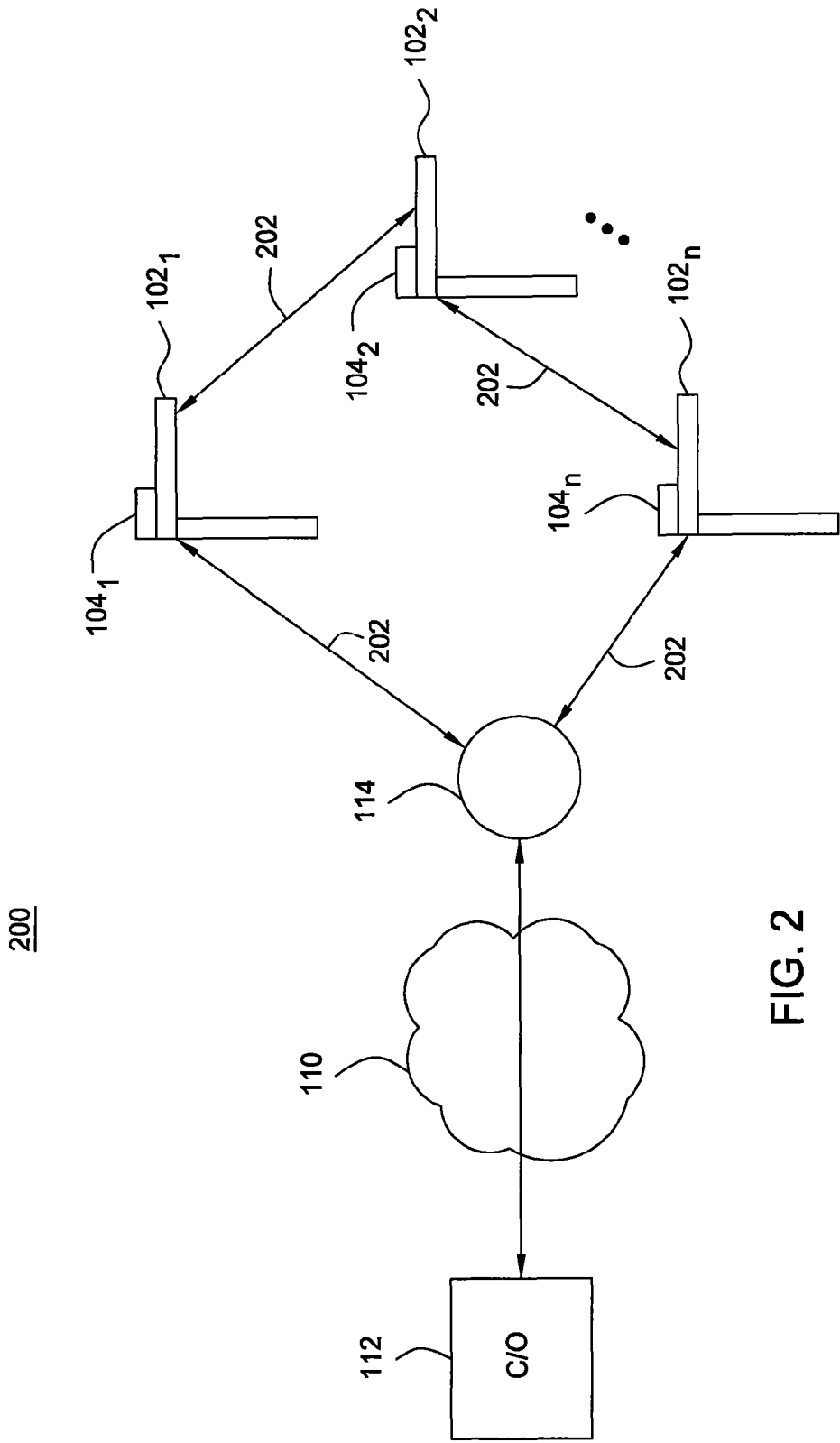
FIG. 2 depicts one embodiment of an architecture for remote monitoring and controlling of LED based street lights using peer-to-peer communications.

FIG. 2 illustrates one embodiment of an architecture 200 for remote monitoring and controlling of LED based street lights 102 using peer-to-peer communications. The architecture 200 includes one or more LED based street lights 102, similar in all respects to the LED based street lights 102 described with respect to FIG. 1 above.

Each one of the LED based street lights $102_1$, $102_2$ to $102_n$ may be coupled to a communication module $104_1$, $104_2$ to $104_n$. The communication modules 104 are similar in all respects to the communication modules 104 described above with respect to FIG. 1 above.

The architecture 200 includes a meter collector 114, the public network 110 and the central office 112. The public network 110 and the central office 112 are similar in all respects to the public network 110 and the central office 112 described above with respect to FIG. 1.

Notably, in FIG. 2, each one of the LED based street lights 102 may communicate with one another as illustrated by arrows 202. For example, information related to the LED based street light $102_1$ may be collected by the communication module $104_1$ and passed on to communication module $104_2$. Information related to the LED based street light $102_2$ may be collected by the communication module $104_2$ and compiled with the information related to the LED based street light $102_1$ and passed on to communication module $104_n$ and so forth.

Eventually, all the information relating to each one of the LED based street lights 102 are forwarded to the meter collector 114. The meter collector 114 may then forward the information over the public network 110 to the central office 112.

Similar to FIG. 1, the central office 112 may also send control signals over the public network 110 back to the meter collector 114. The meter collector 114 may then forward the control signal to the appropriate LED based street light 102 using the peer-to-peer communications.

Figure 3:
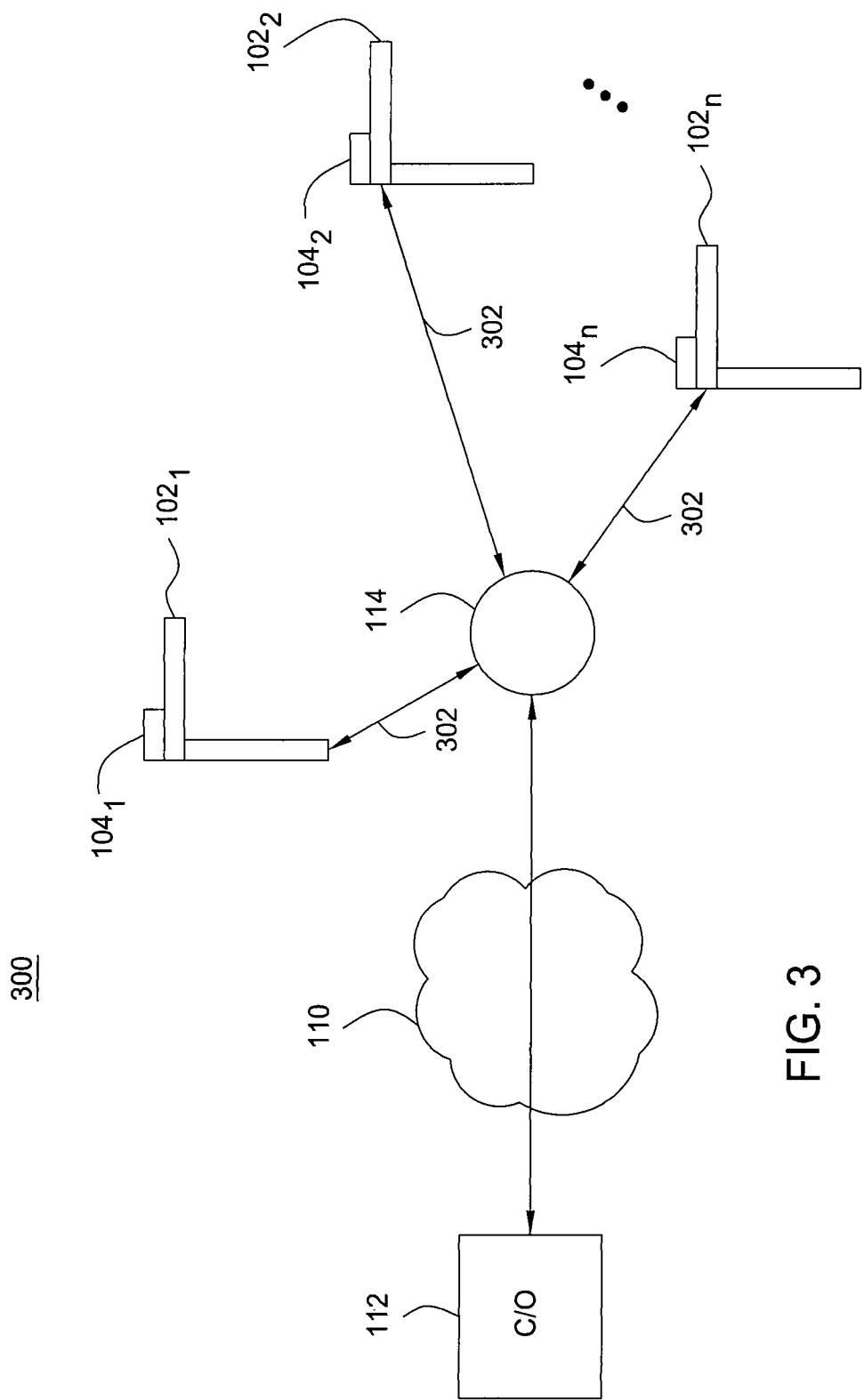
FIG. 3 depicts one embodiment of an architecture for remote monitoring and controlling of LED based street lights using a local meter collector.

FIG. 3 illustrates one embodiment of an architecture 300 for remote monitoring and controlling of LED based street lights 102 using direct communications to a local meter collector. The architecture 300 includes one or more LED based street lights 102, similar in all respects to the LED based street lights 102 described with respect to FIG. 1 above.

Each one of the LED based street lights $102_1$, $102_2$ to $102_n$ may be coupled to a communication module $104_1$, $104_2$ to $104_n$. The communication modules 104 are similar in all respects to the communication modules 104 described above with respect to FIG. 1 above.

The architecture 300 includes a meter collector 114, the public network 110 and the central office 112. The public network 110 and the central office 112 are similar in all respects to the public network 110 and the central office 112 described above with respect to FIG. 1.

Notably, in FIG. 3, each one of the LED based street lights 102 may communicate directly with the meter collector 114 as illustrated by arrows 302. For example, information related to the LED based street light $102_1$ may be communicated directly to the meter collector 114 by the communication module $104_1$. Information related to the LED based street light $102_2$ may be communicated directly to the meter collector 114 by the communication module $104_2$ and so forth.

Eventually, all the information relating to each one of the LED based street lights 102 are forwarded to the meter collector 114. The meter collector 114 may then forward the information over the public network 110 to the central office 112.

Similar to FIG. 1, the central office 112 may also send control signals over the public network 110 back to the meter collector 114. The meter collector 114 may then forward the control signal to the appropriate LED based street light 102 using the direct communications.

In one embodiment, the peer-to-peer architecture 200 and the direct communications architecture 300 may be used to collect information locally on a street via the meter collector 114. Then one or more meter collectors 114 may transmit the collected information over longer distances to the central office 112 via the public network 110.

Figure 4:
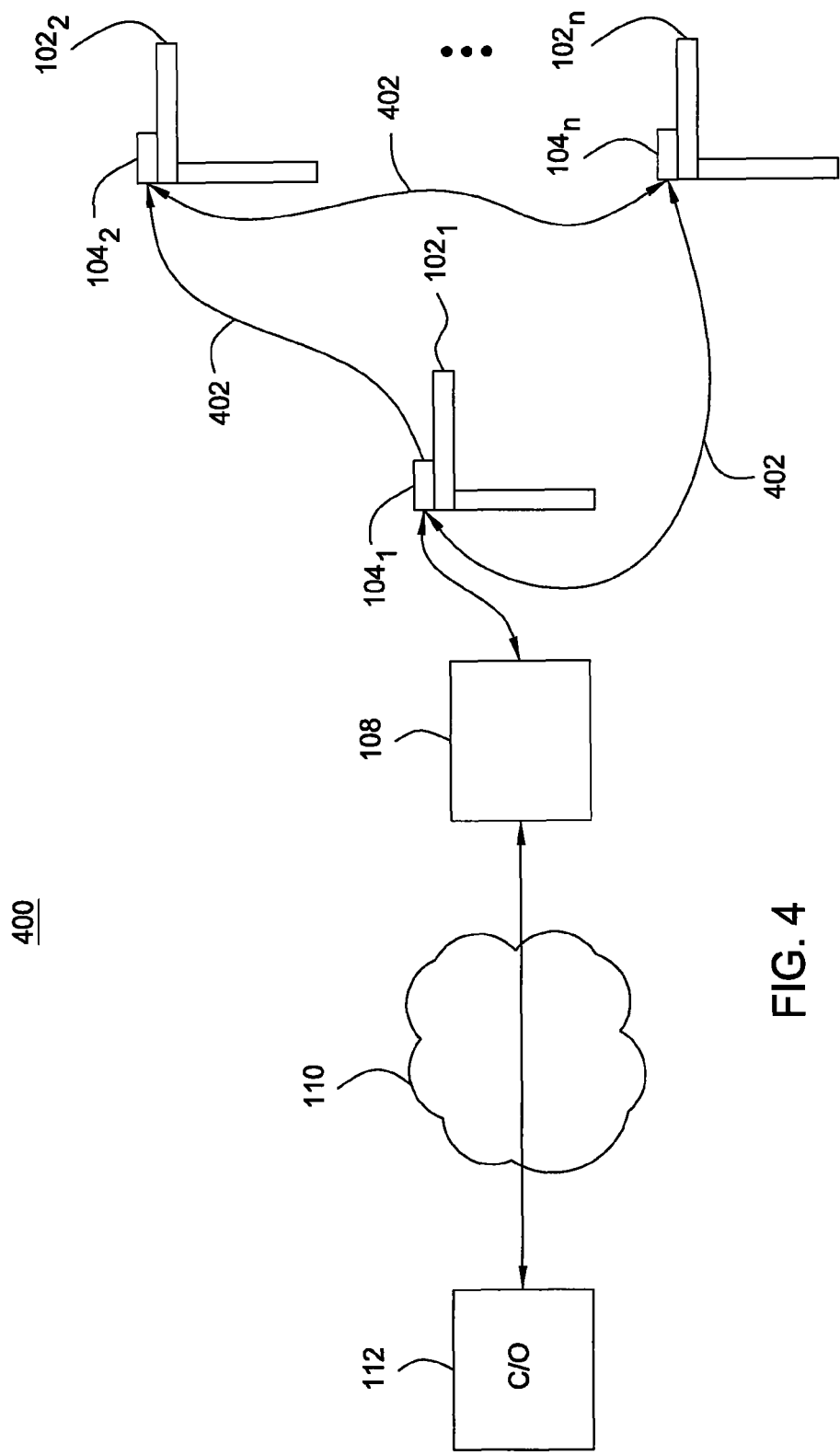
FIG. 4 depicts one embodiment of an architecture for remote monitoring and controlling of LED based street lights using power line modems (PLM)

FIG. 4 illustrates one embodiment of an architecture 400 for remote monitoring and controlling of LED based street lights 102 using power line modems (PLM). The architecture 400 includes one or more LED based street lights 102, similar in all respects to the LED based street lights 102 described with respect to FIG. 1 above.

Each one of the LED based street lights $102_1$, $102_2$ to $102_n$ may be coupled to a communication module $104_1$, $104_2$ to $104_n$. The communication modules 104 in FIG. 4 may comprise a PLM for wired communications.

The architecture 400 includes the gateway 108, the public network 110 and the central office 112. The gateway 108, the public network 110 and the central office 112 are similar in all respects to the gateway 108, the public network 110 and the central office 112 described above with respect to FIG. 1.

Notably, in FIG. 4, each one of the LED based street lights 102 may communicate with one another as illustrated by arrows 402. For example, information related to the LED based street light $102_1$ may be collected by the communication module $104_1$ (e.g., a PLM) and passed on to communication module $104_2$ (e.g., a PLM). Information related to the LED based street light $102_2$ may be collected by the communication module $104_2$ (e.g., a PLM) and compiled with the information related to the LED based street light $102_1$ and passed on to communication module $104_n$ (a PLM) and so forth.

Eventually, all the information relating to each one of the LED based street lights 102 are forwarded to a PLM in communications with the gateway 108. The gateway 108 collects the information and then may forward the information over the public network 110 to the central office 112.

Similar to FIG. 1, the central office 112 may also send control signals over the public network 110 back to the gateway 108. The gateway 108 may then forward the control signal to the appropriate LED based street light 102 using the PLM communications protocol.

FIG. 4 may also include a meter collector (not shown) for collecting information from utility meters coupled to homes. In one embodiment, the meter collector may also communicate with the PLMs to provide information related to the homes. Thus, the PLMs may forward utility information related to the homes along with the information related to the LED based street lights 102 to the central office 112 via the gateway 108 and the public network 110.

Figure 5:
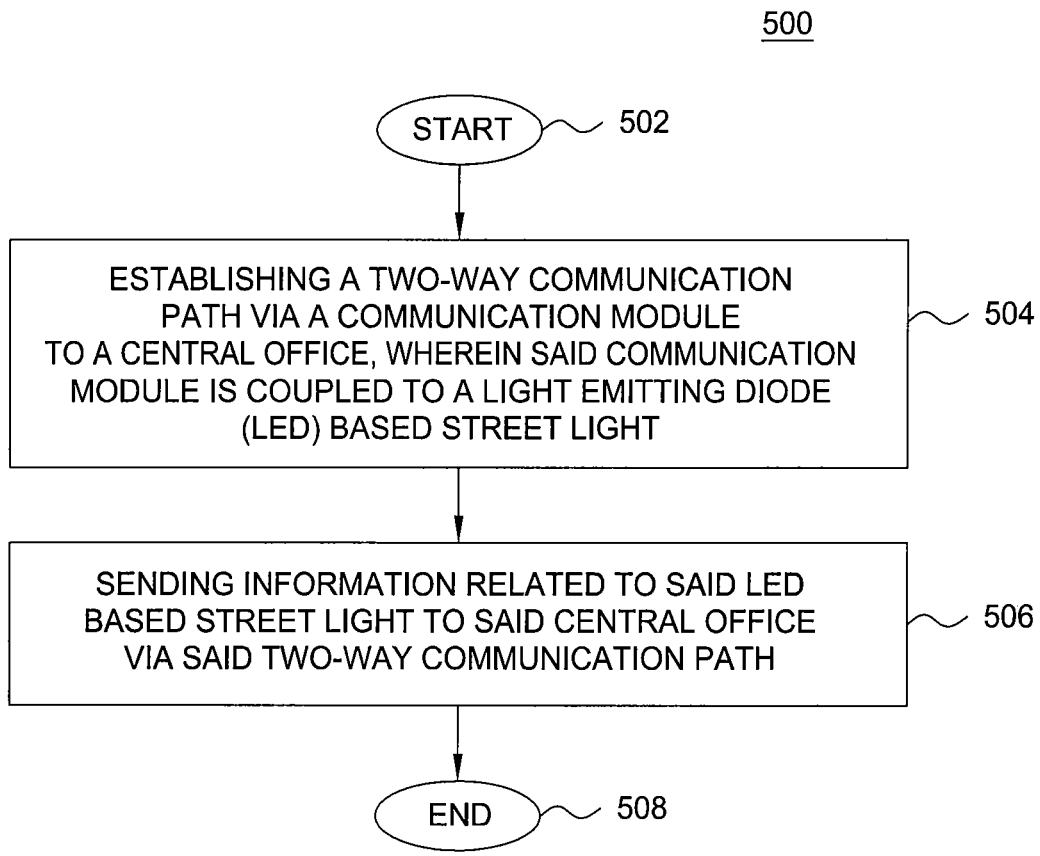
FIG. 5 depicts a flow chart for one embodiment of a method for remotely monitoring and controlling the LED based street light.

FIG. 5 illustrates one embodiment of a flow chart for a method 500 for remotely monitoring and controlling the LED based street light. In one embodiment, the method 500 may be carried out by a communication module 104 coupled to a LED based street lights 102, as described above.

The method 500 begins at step 502. At step 504, the method 500 establishes a two-way communication path via said communication module to a central office via a communication module coupled to the LED based street light. The communication module may be any one of the communication modules described above. For example, information from the LED based street light and control signals from the central office may be exchanged in both directions via the two-way communications path.

At step 506, the method 500 sends information related to the LED based street light to the central office via the two-way communication path. The method 500 ends at step 508.

Figure 6:
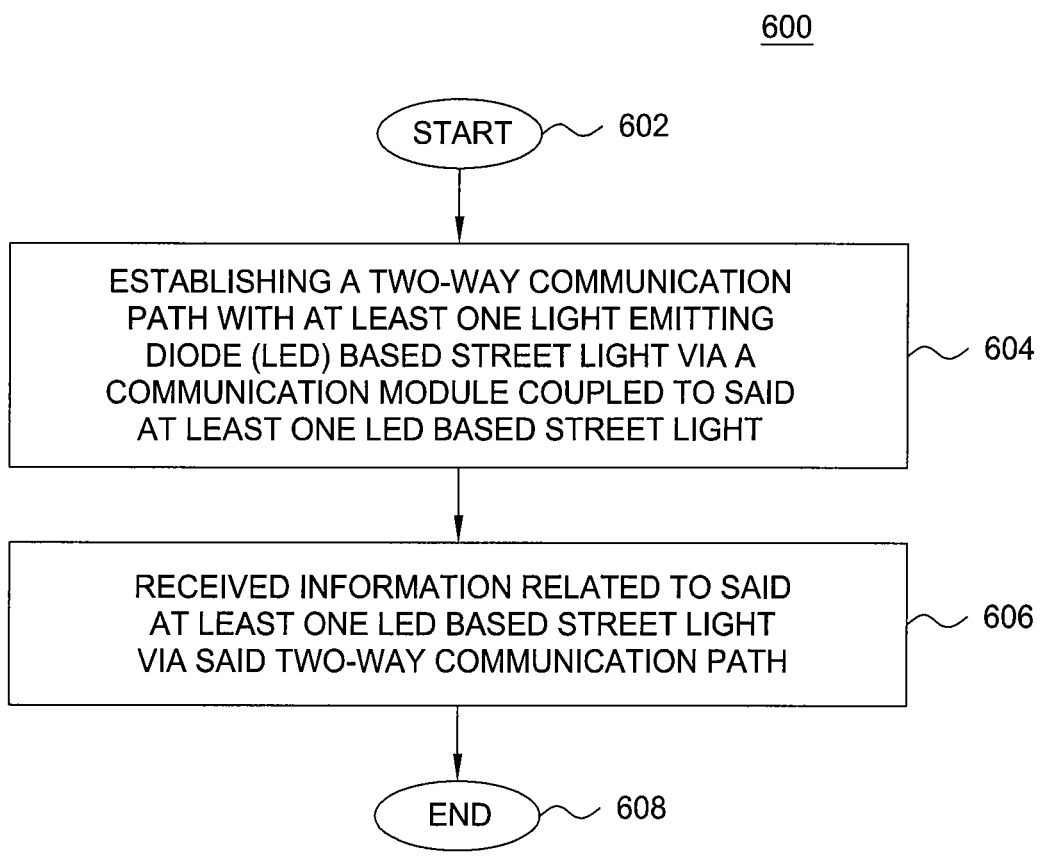
FIG. 6 depicts a flow chart for another embodiment of a method for remotely monitoring and controlling the LED based street light.

FIG. 6 illustrates one embodiment of a flow chart for a method 600 for remotely monitoring and controlling the LED based street light. In one embodiment, the method 600 may be carried out by the central office 112.

The method 600 begins at step 602. At step 604, the method 600 establishes a two-way communication path with at least one LED based street light via a communication module coupled to the at least one LED based street light. For example, information from the LED based street light and control signals from the central office may be exchanged in both directions via the two-way communications path. The communication module may be any one of the communication modules described above.

At step 606, the method 600 receives information related to the at least one LED based street light via the two-way communication path. The method 600 ends at step 608.

Figure 7:
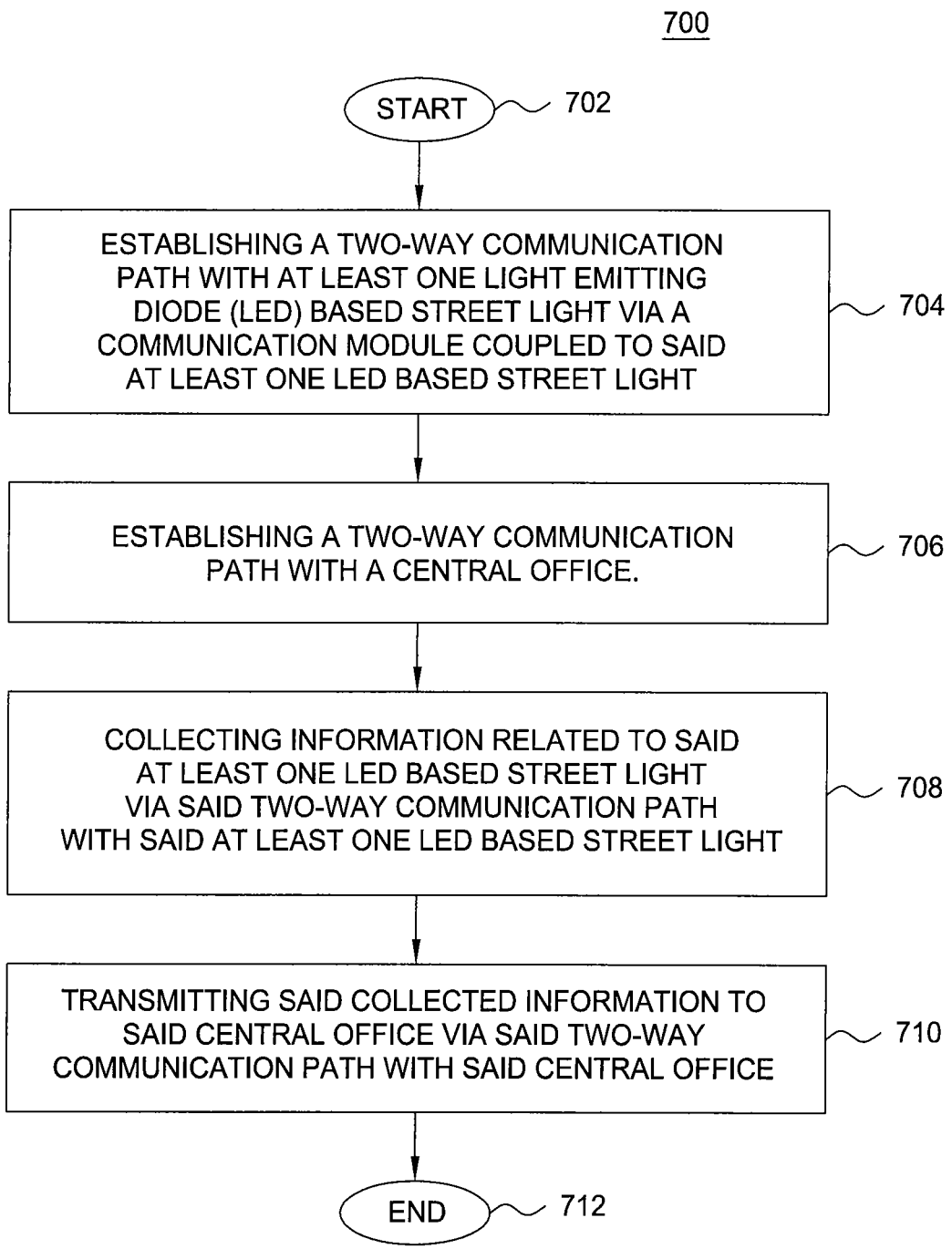
FIG. 7 depicts a flow chart for yet another embodiment of a method for remotely monitoring and controlling the LED based street light.

FIG. 7 illustrates one embodiment of a flow chart for a method 700 for remotely monitoring and controlling the LED based street light. In one embodiment, the method 700 may be carried out by the meter collector 114 or the gateway 108.

The method 700 begins at step 702. At step 704, the method 700 establishes a two-way communication path with at least one LED based street light via a communication module coupled to the at least one LED based street light. The communication module may be any one of the communication modules described above.

At step 706, the method 700 establishes a two-way communication path with a central office. For example, the central office 112 illustrated in FIGS. 1-4. For example, information from the LED based street light and control signals from the central office may be exchanged in both directions via the two-way communications paths.

At step 708, the method 700 collects information related to the at least one LED based street light via the two-way communication path with the at least one LED based street light. For example, the two-way communication path may be a peer-to-peer communication, a direct communication or a communication using PLM, as illustrated above in FIGS. 1-4.

At step 710, the method 700 transmits the collected information to the central office via the two-way communication path with the central office. The method 700 ends at step 708.

While various embodiments have been described above, it should be understood that they have been presented by way of example only, and not limitation. Thus, the breadth and scope of a preferred embodiment should not be limited by any of the above-described embodiments, but should be defined only in accordance with the following claims and their equivalents.

What is claimed is:

1. A method for remotely monitoring and controlling a light emitting diode (LED) based street light, comprising:
    establishing a two-way communication path via a communication module to a central office, wherein said communication module is coupled to said LED based street light, wherein said LED based street light comprises a plurality of independently controllable groups of LEDs;
    sending by said communications module information related to said LED based street light to a meter collector, which then forwards said information to said central office via said two-way communication path, wherein said two-way communication path traverses an Advanced Metering Infrastructure (AMI); and
    receiving by said communications module at least one control signal from said central office via said two-way communication path, wherein the at least one control signal turns on only one of the plurality of independently controllable groups of LEDs.

2. The method of claim 1, wherein said at least one control signal comprises at least one of: a signal to remotely turn off said LED based street light, a signal to turn on said LED based street light, a signal to adjust a brightness of said LED based street light or a signal to request an on demand health check of said LED based street light.

3. The method of claim 1, wherein said communication module communicates via at least one of: a 900 megahertz (MHz) spread spectrum band, a ZigBee protocol, a power line communication protocol, a cellular protocol, a satellite communication protocol, a paging communication protocol or any combination thereof.

4. The method of claim 1, wherein said two-way communication path traverses at least one public network.

5. The method of claim 1, wherein said information comprises at least one of: reporting information or diagnostic information.

6. The method of claim 5, wherein said reporting information comprises at least one of: a burn time, a fault with a time-stamp, a number of ignitions, an amount of kilo-watt hours (KWH) usage, a number of functioning LEDs within said LED based street light, a light output factor of said LED based street light or a light degradation factor of said LED based street light.

7. The method of claim 5, wherein said diagnostic information comprises at least one of: a fixture malfunction or a photo controller failure.

8. A method for remotely monitoring and controlling at least one light emitting diode (LED) based street light, comprising:
    establishing a two-way communication path with said at least one LED based street light via a communication module coupled to said at least one LED based street light, wherein said at least one LED based street light comprises a plurality of independently controllable groups of LEDs;
    receiving at a central office information related to said at least one LED based street light via said two-way communication path from a meter collector that received said information from said at least one LED based street light, wherein said two-way communication path traverses an Advanced Metering Infrastructure (AMI);
    transmitting from a central office at least one control signal to said at least one LED based street light via said two-way communication path, wherein the at least one control signal turns on only one of the plurality of independently controllable groups of LEDs.

9. The method of claim 8, wherein said at least one control signal comprises at least one of: a signal to remotely turn off said LED based street light, a signal to turn on said LED based street light, a signal to adjust a brightness of said LED based street light or a signal to request an on demand health check of said LED based street light.

10. The method of claim 8, wherein said information comprises at least one of: reporting information or diagnostic information.

11. The method of claim 10, wherein said reporting information comprises at least one of: a burn time, a fault with a time-stamp, a number of ignitions, an amount of kilo-watt hours (KWH) usage, a number of functioning LEDs within said LED based street light, a light output factor of said LED based street light or a light degradation factor of said LED based street light.

12. The method of claim 10, wherein said diagnostic information comprises at least one of: a fixture malfunction or a photo controller failure.

13. A method for remotely monitoring and controlling at least one light emitting diode (LED) based street light, comprising:
    establishing a two-way communication path with said at least one LED based street light via a communication module coupled to said at least one LED based street light, wherein said at least one LED based street light comprises a plurality of independently controllable groups of LEDs;
    establishing a two-way communication path with a central office, wherein said two-way communication path traverses an Advanced Metering Infrastructure (AMI);
    collecting information related to said at least one LED based street light via said two-way communication path with said at least one LED based street light;
    transmitting said collected information to a meter collector, which then forwards said collected information to said central office via said two-way communication path with said central office;

transmitting from said central office said at least one control signal to said at least one LED based street light to turn on only said one of the plurality of independently controllable groups of LEDs; and receiving by said at least one LED based street light at least one control signal from said central office, wherein the at least one control signal turns on only one of the plurality of independently controllable groups of LEDs.

14. The method of claim 13, wherein said at least one control signal comprises at least one of: a signal to remotely turn off said LED based street light, a signal to turn on said LED based street light, a signal to adjust a brightness of said LED based street light or a signal to request an on demand health check of said LED based street light.

15. The method of claim 13, wherein said information comprises at least one of: reporting information or diagnostic information.

16. The method of claim 15, wherein said reporting information comprises at least one of: a burn time, a fault with a time-stamp, a number of ignitions, an amount of kilo-watt hours (KWH) usage, a number of functioning LEDs within said LED based street light, a light output factor of said LED based street light or a light degradation factor of said LED based street light.

17. The method of claim 15, wherein said diagnostic information comprises at least one of: a fixture malfunction or a photo controller failure.

* * * * *